United States Patent [19]

Hochstein

[11] 4,453,264
[45] Jun. 5, 1984

[54] AMPLIFIER POWER SUPPLY CONTROLLED BY AUDIO SIGNAL

[76] Inventor: Peter A. Hochstein, 14020 Fifteen Mile Rd., Sterling Heights, Mich. 48077

[21] Appl. No.: 422,261

[22] Filed: Sep. 23, 1982

[51] Int. Cl.³ .............................................. H04B 3/00
[52] U.S. Cl. .................................... 381/110; 381/123; 381/120; 381/86; 455/343
[58] Field of Search .............. 455/343, 221; 179/81 B, 179/6.14, 2 B; 381/86, 110, 123, 120, 1 VC

[56] References Cited

FOREIGN PATENT DOCUMENTS 55-77241 6/1980 Japan ...................................... 455/343

Primary Examiner—Harold I. Pitts
Assistant Examiner—James L. Dwyer
Attorney, Agent, or Firm—Harold W. Milton, Jr.

[57] ABSTRACT

A power control circuit (22) for selectively supplying power from a constantly available power source (20) to an amplified speaker (12) by sensing the existence of an audio signal in a differential stage by determining the differential potential signal between leads (16, 18) to produce a ground reference signal which is amplified by a transistor (28) and thereafter rectified (52) to provide a direct current signal which operates a relay driver transistor (42) which, in turn, operates a relay switch (46) to supply power to the speaker amplifier (14). The discontinuance of power to the speaker amplifier is delayed for a period of time after the discontinuance of the audio signal to the differential stage (24) by placing a capacitor (58) between the rectifier and the relay driver transistor (42) to power the relay driver transistor for a period of time after the audio signal is no longer being provided.

19 Claims, 1 Drawing Figure

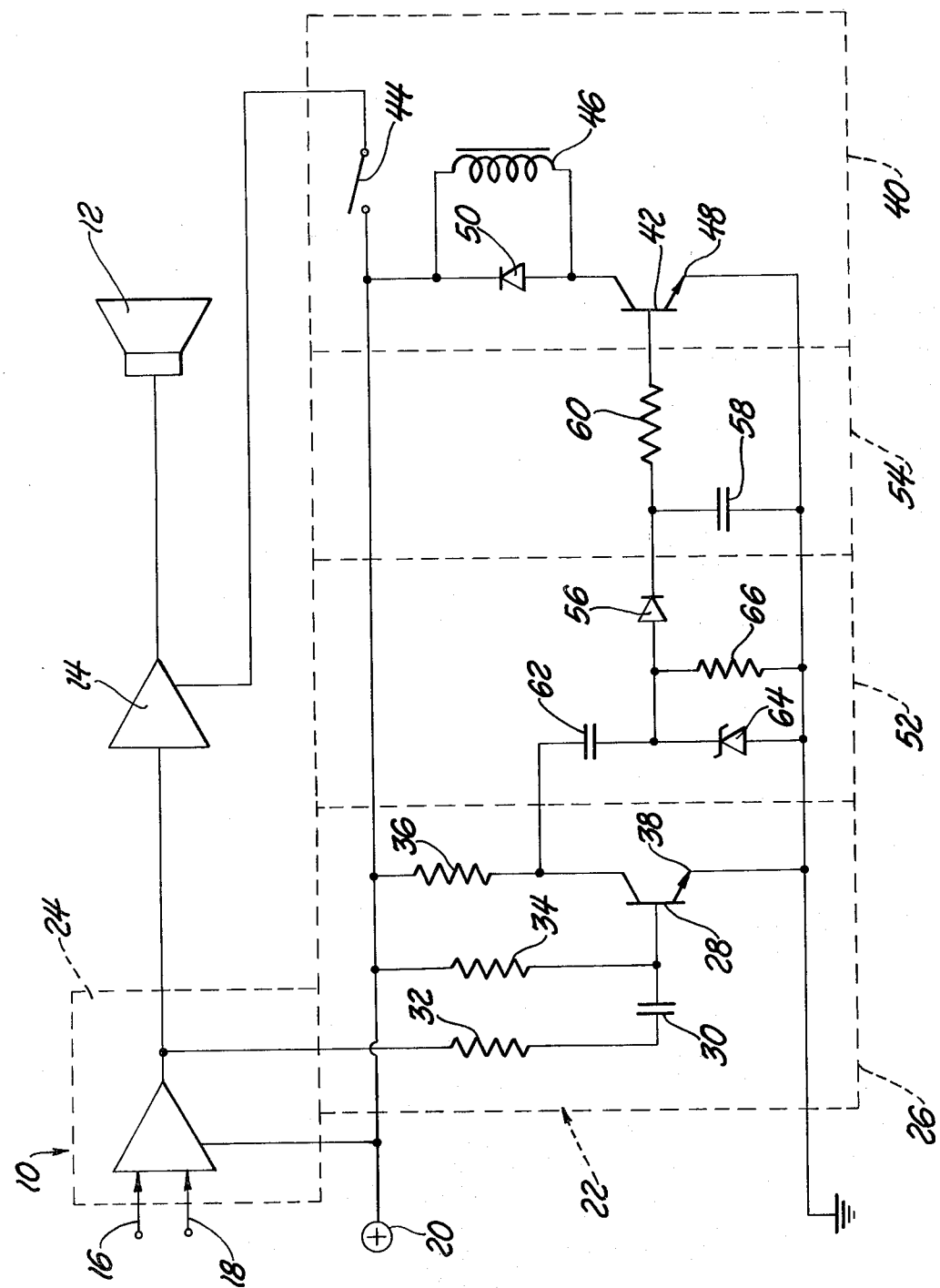

AMPLIFIER POWER SUPPLY CONTROLLED BY AUDIO SIGNAL

TECHNICAL FIELD

The subject invention relates to audio transducers and, particularly, audio speakers utilized with automotive radios.

BACKGROUND ART

Audio speakers are extensively utilized in automobiles to generate acoustic signals from the automotive radio. Such audio speakers are frequently placed in the rear of the automobile, most typically below the shelf immediately under the rear window and behind the rear seat. Such audio speakers typically have two leads providing a signal to the speaker voice coil in order to generate the audio acoustic signal. In certain instances, one of the leads would be ground, i.e., the speaker would be grounded either by contact with the vehicle body or by a ground lead extending from the speaker to the vehicle body. The other lead would extend from the speaker through the car, typically under the floor mats, to the radio so that the radio would send the audio signal over the reference lead and through the ground lead to the speaker. In other instances, two leads extend from the speaker to the radio, neither of which is ground but there remains a difference in potential between the leads when an audio signal is being sent to the speaker from the radio.

It is often desired to improve the quality of the speakers in an automobile. This is typically accomplished by replacing the speakers in the automobile with speakers which are amplified by having an amplifier supported by or connected directly to the speaker. The problem with such amplified speakers is that the amplifier at the speaker must be powered and, therefore, an additional power lead must be disposed within the automobile to extend from the speaker amplifier to the radio so that the amplifier on the speaker is powered only when the radio is turned on. In other words, an amplified speaker may not simply be substituted for the speaker in the automobile with the existing leads connected to the speaker because the amplified speaker must be powered and therefore a power line must be extended between the amplified speaker and the radio, which is not an easy task, if the wire is to be hidden.

STATEMENT OF INVENTION AND ADVANTAGES

A power control circuit and method for selectively supplying power from a constantly available power source to an audio amplifier means for an acoustic transducer, amplifier means being of the differential input type, wherein first and second input leads receive the audio signal, either differentially with neither lead grounded, or receive the input signal in reference to ground with one input lead grounded. A sensing means is utilized to produce a control signal by sensing the existence of an audio signal at the input to the audio amplifier by determining the difference in potential between the input leads. A switching means is utilized to close a power switching circuit to power the audio amplifier means from the power source in response to the control signal so that the power amplifier means does not receive power in the absence of an audio input signal.

Accordingly, an amplified audio speaker utilizing the subject invention may be substituted for the existing speaker in an automobile without running a power lead from the amplifier back to the radio. Specifically, the amplified speaker utilizing the subject invention may be substituted for an existing speaker in the automobile by being connected to the existing speaker leads and with a power lead connected to any adjacent constantly available power source. Most typically, the speakers in the rear deck of an automobile may have power source connected to the power source for the trunk light, which is always hot or constantly available. However, power will not be drained from the constantly available power source in accordance with the instant invention unless an audio signal is being sent to the amplified speaker over the existing speaker leads. When an audio signal is being sent to the amplified speaker, the subject invention will sense the existence of that audio signal and close a switch whereby power is supplied from the constantly available nearby power source to the amplifier for the speaker.

BRIEF DESCRIPTION OF THE DRAWING

Other advantages will be readily appreciated as the same becomes better understood by reference to the following detailed description when considered in connection with the accompanying drawing, which is a circuit diagram showing an amplified speaker utilizing the subject invention.

DESCRIPTION OF THE PREFERRED EMBODIMENT

An acoustic transducer or speaker assembly utilizing the subject invention is generally shown at 10. The assembly 10 includes a transducer or speaker 12 which is of a type well known in the art for converting variations of electrical energy in an audio signal into corresponding variations of acoustic energy. The assembly also includes audio power amplifier means 14 which is for amplifying the audio signal supplied to the assembly from a radio or the like. The power amplifier 14 may be one of well known types and may be supported on the speaker or speaker housing.

The assembly 10 includes first and second signal leads 16 and 18 for receiveing an audio signal from a radio or the like. As alluded to above, one of the signal leads 16 or 18 may be a ground lead which is connected to the vehicle body to establish a ground. Instead of an actual wire lead, one of the leads 16 or 18 may be represented by the housing of the speaker being directly grounded to a portion of the vehicle body. The other of the signal leads 16 and 18 would then extend to the radio for receving the audio signal. In such a case there would be a potential difference between the leads 16 and 18, that is, there would clearly be a potential difference between one of the leads 16 or 18 and the ground on the other lead 16 or 18. Alternatively, both of the signal leads 16 and 18 may lead to the radio for receiving an audio signal, in which case neither of the leads 16 or 18 would be grounded but there would be a potential difference between the leads 16 or 18 when an audio signal is being transmitted to the assembly 10.

The assembly 10 also includes a power lead 20 for attachment to a source of constant power for supplying power to the audio amplifier means 14. In other words, the power lead 20 may be attached to a hot lead in the automobile such as the lead for the trunk light and, in accordance with the power control circuit of the subject invention, generally indicated at 22, a power will be supplied to the speaker amplifier 14 in response to an audio signal on the signal leads 16 and 18.

The power control circuit 22 includes sensing means comprising a differential stage 24 for sensing the existence of an audio signal by determining the difference in potential between the signal leads 16 and 18 to produce a control signal. The differential stage 24 generates a ground referenced signal from the differential input signal developed across signal leads 16 and 18.

The sensing means also includes an amplifier 26 for amplifying the ground referenced signal from the differential stage 24 to produce the control signal. The amplifier 26 includes a first transistor 28 configured as a low level amplifier for receiving the ground referenced signal from the differential stage 24. The transistor 28 is a high gain Darlington NPN transistor. The amplifier circuit 26 includes a filtering means comprising a first capacitor 30 for filtering out direct current components of the ground referenced signal from the differential stage 24 to amplify only the alternating current components to produce the control signal out of the transistor 28. A first resistor 32 receives the ground reference signal from the differential stage 24 and the first capacitor 30 receives the ground reference signal from the resistor 32. There is also included a biasing resistor 34 between the input to the first transistor 28 and the power source 20 for biasing the first transistor 28 into conduction. There is also included a collector or load resistor 36 between the output of the first transistor 28 and the power source 20. The emitter 38 of the first transistor 28 is connected to ground.

The power control circuit 22 also includes switch means 40 for powering the audio amplifier means 14 from the power source 20 in response to the control signal from the amplifier 26 so that the power amplifier means 14 does not receive power from the power source 20 in the absence of an audio signal being sent to the assembly 10 over the input signal leads 16 and 18. More specifically, the switch means 40 comprises a second transistor 42 configured as a relay driver. The transistor 42 is a Darlington relay driver for receiving the control signal. The switch means also includes switch or relay contact 44 which is opened and closed by a relay 46 which is, in turn, controlled by the transistor 42. The collector of transistor 42 is connected to the relay 46 and the emitter 48 of the transistor 42 is connected to ground. A free-wheeling diode 50 is in parallel with the relay 46 for protecting the transistor 42 by preventing back EMF from damaging the transistor 42.

The power circuit 22 also includes a rectifier means 52 for rectifying the alternating current control signal received from the amplifier 26 to produce a direct current control signal to operate the switch means 40 to power the audio amplifier means 14.

The power control circuit 22 also includes a time delay means 54 for delaying the opening of the power circuit or switch 44 to discontinue power from the power source 20 to the audio amplifier means 14 for a period of time after the control signal to the transistor 42 is discontinued as a result of the absence of an audio signal on the input signal leads 16 and 18.

As the capacitor 30 filters out direct current components of the ground reference signal, the first transistor 28 produces an alternating current control signal which is received by the rectifier diode 56 in the rectifier means 52 which changes the alternating current audio signal to a varying direct current. The time delay means 54 includes a second capacitor 58 interconnecting the output of the rectifier diode 56 and ground. The DC output of the rectifier diode 56 charges the capacitor 58 so that when the control signal is discontinued, the charge stored in the capacitor 58 continues to power transistor 42 for a period of time. The time delay circuit 54 includes a second resistor 60 between the capacitor 58 and the transistor 42 of the switch means 40 for limiting the discharge current flow from the capacitor 58 to the transistor 42. By way of example, the energy stored in the capacitor 58 could maintain the switch 44 closed for approximately 40 seconds after the absence of an audio signal on the input leads 16 and 18.

The rectifier means or circuit 52 includes a third capacitor 62 for receiving the control signal from the first transistor 28 to block the direct current components in the control signal. A zener diode 64 interconnects the output of the third capacitor 62 and ground for limiting the charge in the capacitor 62. In other words, the zener diode 64 limits the maximum voltage in the capacitor 62. A current drawing resistor 66 connects the signal flow or line between the zener diode 64 and the rectifier diode 56 with ground for drawing current from the capacitor 62.

The following are values for the various components which may be used in a circuit made in accordance with the subject invention, it being understood that the values are exemplary and various combinations of value may be used in the various components utilized in practicing the invention.

Resistor 32: 10K
Capacitor 30: 10 μF
Resistor 34: 20Meg
Transistor 28: MPSA 13
Resistor 36: 3.3K
Capacitor 62: 10 μF
Zener Diode 64: 3.9v
Resistor 66: 22K
Rectifier Diode 56: 1N4608
Capacitor 58: 47 μF
Resistor 60: 100K
Transistor 42: MPSA 13
Relay 46: Aromat HB 1-DC 12V (400 ohm coil)
Diode 50: 1N4004

Accordingly, in accordance with the subject invention, there is provided a method of supplying power from a constantly available or hot power source 20 to an audio amplifier means 14 associated with an acoustic transducer or speaker 12 which is of the type utilizing first and second input leads 16 and 18 having a difference in potential in response to an audio signal from a radio, or the like, including the steps of producing a control signal by sensing the existence of an audio signal by determining the difference in potential between the leads 16 and 18 and closing a power circuit by a switch or contact 44 in response to the control signal to allow power from the power source 20 to power the audio amplifier means 14 so that the audio amplifier means 14 does not receive power in the absence of an audio signal being sent to the audio amplifier over the input signal leads 16 and 18. This is accomplished specifically by generating a ground referenced signal from the differential signal in the leads 16 and 18 in the differential stage 24 and amplifying the ground referenced signal in the amplifier circuit 26 to produce an alternating current control signal. More specifically, the method includes the step of delaying the opening of the power circuit contacts 44 to discontinue the power from the power source 20 to the audio amplifier means 14 by the time delay circuit 54 for a period of time after the control signal is discontinued as a result of the absence of an audio signal on the input signal leads 16 and 18. The method further includes the filtering out of direct current components with the capacitor 30 of the ground referenced signal to amplify with the transistor 28 only the alternating current components to produce the control signal. The method is further characterized by rectifying the alternating current control signal from the amplifying circuit 26 with the rectifier circuit 52 to produce a direct current control signal to operate the switch means 40 to close the power circuit to the audio amplifier means 14.

The invention has been described in a illustrative manner, and it is to be understood that the terminolgy which has been used is intended to be in the nature of words of description rather than of limitation.

Obviously, many modifications and variations of the present invention are possible in light of the above teachings. It is, therefore, to be understood that within the scope of the appended claims wherein reference numerals are merely for convenience and are not to be in any way limiting, the invention may be practiced otherwise than as specifically described.

The embodiments of the invention in which an exclusive property or privilege is claimed are defined as follows:

1. A method of supplying power from a constantly available power source (20) to an audio amplifier means (14) for an acoustic transducer (12) amplifier means of the type utilizing first and second input leads (16, 18) having a difference in potential responsive to an audio signal, said method comprising the steps of producing a control signal by sensing (24) the existence of an audio signal by determining the difference in potential between the input leads (16, 18), and closing a power circuit (44) in response to the control signal to allow power from the power source (20) to power the audio amplifier means (14) so that the audio amplifier means does not receive power in the absence of an audio signal being sent to the audio amplifier means, and generating (24) a ground reference signal from the differential input leads (16, 18) and amplifying (26) the ground referenced signal to produce the control signal.

2. A method as set forth in claim 1 further defined as delaying (54) the opening of the power circuit to discontinue power from the power source (20) to the audio amplifier means (14) for a period of time after the control signal is discontinued as a result of the absence of an audio signal.

3. A method as set forth in claim 2 further defined as filtering (30) out direct current components of the ground reference signal to amplify (28) only the alternating current components to produce the control signal.

4. A method as set forth in claim 3 further defined as rectifying (56) the alternating current control signal to produce a direct current control signal to operate a switch means (40) to close the power circuit.

5. A power control circuit (22) for selectively supplying power from a constantly available power source (20) to an audio amplifier means (14) for an audio transducer (12) of the type utilizing first and second input leads (16, 18) having a difference in potential responsive to an audio signal, said control circuit (22) comprising; sensing means (24, 26) for sensing the existence of an audio signal by determining the difference in potential between the input leads (16, 18) to produce a control signal, switch means (40) for powering the audio amplifier means (14) from the power source (20) in response to said control signal so that the power amplifier means (14) does not receive power in the absence of an audio signal being sent to the circuit audio amplifier means, said sensing means (24, 26) including a differential stage (24) for generating a ground referenced signal from the differential input signals (16, 18) and an amplifier (26) for amplifying the ground referenced signal to produce the control signal.

6. A circuit as set forth in claim 5 including time delay means (54) for delaying the opening of the power circuit (44) to discontinue power from the power source (20) to the audio amplifier means (14) for a period of time after the control signal is discontinued as a result of the absence of an audio signal.

7. A circuit as set forth in claim 6 including filtering means (30) for filtering out direct current components of the ground reference signal to amplify only the alternating current components to produce the control signal.

8. A circuit as set forth in claim 7 including rectifier means (52) for rectifying the alternating current control signal to produce a direct current control signal to operate said switch means (40) to power the audio amplifier means (14).

9. A circuit as set forth in claim 8 including a first resistor (32) receiving the ground referenced signal from said differential stage (24), said filter means (30) comprising a first capacitor receiving the ground referenced signal from said first resistor (32).

10. A circuit as set forth in claim 9 wherein said amplifier (26) comprises a first transistor (28) configured as a low level amplifier for receiving the ground referenced signal from said first capacitor (30) to produce the alternating current control signal.

11. A circuit as set forth in claim 10 wherein said rectifier means (52) includes a rectifier diode (56) receiving the alternating current control signal from said first transistor (28).

12. A circuit as set forth in claim 1 wherein said time delay means (54) includes a second capacitor (58) interconnecting the output of said rectifier diode (56) and ground potential.

13. A circuit as set forth in claim 12 wherein said time delay means (54) further includes a second resistor (60) between said second capacitor (58) and said switch means (40) for limiting the discharge current flow from said second capacitor (58) to said switch means (40).

14. A circuit as set forth in claim 13 wherein said switch means (40) comprises a second transistor (429 configured as a relay driver and contacts (44) and a relay (46) controlled by said second transistor (42) for operating said contacts (44).

15. A circuit as set forth in claim 14 including a biasing resistor (34) between the input to said first transistor (28) and the power source (20) for biasing said first transistor (28) into conduction and a lead resistor (36) between the output of said first transistor (28) and the power source (20), said first transistor (28) being connected (38) to ground.

16. A circuit as set forth in claim 15 including a third capacitor (62) receiving the control signal from said first transitor (28), a zener diode (64) interconnecting the output of said third capacitor (62) and ground for limiting the charge of said third capacitor (62), a current draining resistor (66) connecting the signal flow path between said zener diode (64) and said rectifier diode (56) with ground for driving current from said third capacitor (62).

17. A circuit as set forth in claim 16 including a freewheeling diode (50) in parallel with said relay (46) for protecting said second transistor (42).

18. An amplified audio speaker assembly (10) comprising; a transducer means (12) for converting variations of electrical energy in an audio signal into corresponding variations of acoustic energy, audio signal into corresponding variations of acoustic energy, audio amplifier means (14) supported by said transducer means (12) for amplifying the audio signal supplied to said transducer means, said assembly including input signal leads (16, 18) for receiving an audio signal, said assembly including a power lead (20) for attachment to a source of constant power to supply power to said audio amplifier means (14), and control circuit means (22) supported by said transducer means (12) and including sensing means (24, 26) for sensing the existence of an audio signal by determining the difference in potential between the input leads (16, 18) to produce a control signal and switch means (40) for providing power to said audio amplifier means (14) from said power lead (20) in response to said control signal so that said audio amplifier means (14) does not receive power in the absence of an audio signal being recieved on said input leads (16, 18), said sensing means (24, 26) including a differential stage (24) for generating a ground referenced signal from the differential input signal (16, 18) and an amplifier (26) for amplifying the ground referenced signal to produce the control signal, said differential stage (24) also providing the ground referenced signal to said audio amplifier means (14).

19. A circuit as set forth in claim 18 including time delay means (54) for delaying the opening of the power circuit (44) to discontinue power from the power source (20) to the audio amplifier means (14) for a period of time after the control signal is discontinued as a result of the absence of an audio signal.

* * * * *